United States Patent [19]

Kurihara

[11] Patent Number: 5,246,198
[45] Date of Patent: Sep. 21, 1993

[54] DIAMOND CRYSTAL COATED MOLD FOR FORMING OPTICAL ELEMENTS

[75] Inventor: Noriko Kurihara, Nerima, Japan

[73] Assignee: Canon Kabushiki Kaisha, Tokyo, Japan

[21] Appl. No.: 707,782

[22] Filed: May 30, 1991

[30] Foreign Application Priority Data

Jun. 1, 1990 [JP] Japan .................... 2-141621
Jun. 1, 1990 [JP] Japan .................... 2-141623

[51] Int. Cl.$^5$ .................... B29C 33/56; C03B 11/08
[52] U.S. Cl. .................... 249/114.1; 65/374.15; 249/115
[58] Field of Search .................... 249/114.1, 115, 134; 425/406; 65/26, 305, 374.11, 374.15

[56] References Cited

U.S. PATENT DOCUMENTS

| | | | |
|---|---|---|---|
| 4,882,827 | 11/1989 | Kusumi et al. | 65/374.15 |
| 5,026,415 | 6/1991 | Yamamoto et al. | 249/114.1 |
| 5,112,025 | 5/1992 | Nakayama et al. | 249/114.1 |

FOREIGN PATENT DOCUMENTS

| | | | |
|---|---|---|---|
| 49-5112 | 1/1974 | Japan . | |
| 52-45613 | 4/1977 | Japan . | |
| 60-246230 | 12/1985 | Japan . | |
| 61-183134 | 8/1986 | Japan . | |
| 61-242922 | 10/1986 | Japan . | |
| 61-281030 | 12/1986 | Japan | 65/374.15 |
| 1-301864 | 12/1989 | Japan . | |
| 2-51434 | 2/1990 | Japan | 65/374.15 |

Primary Examiner—Jay H. Woo
Assistant Examiner—James P. Mackey
Attorney, Agent, or Firm—Fitzpatrick, Cella, Harper & Scinto

[57] ABSTRACT

Disclosed is a mold for forming glass material into optical elements, such as lenses and prisms, by press molding. In particular, the optical-element-molding surface of this mold is coated with diamond crystals in predetermined, spaced apart portions.

5 Claims, 6 Drawing Sheets

Ar ION BEAM

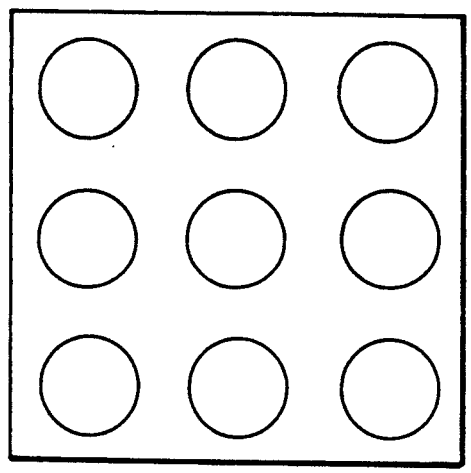
FIG. IG
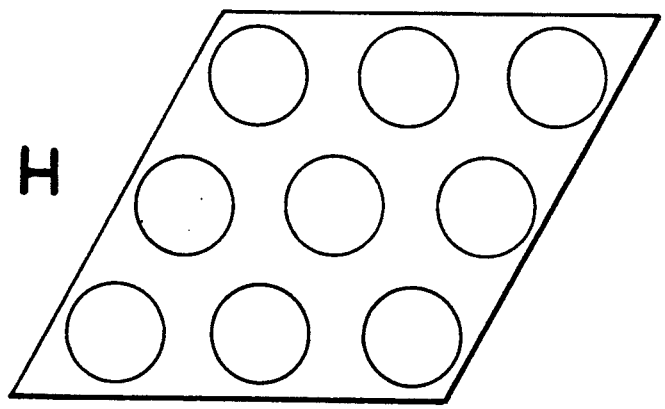
FIG. IH

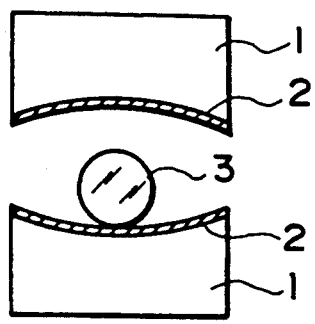
F I G. 2
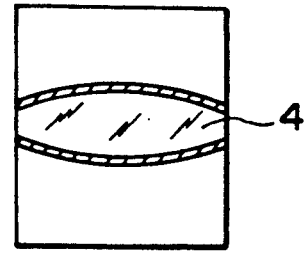
F I G. 3
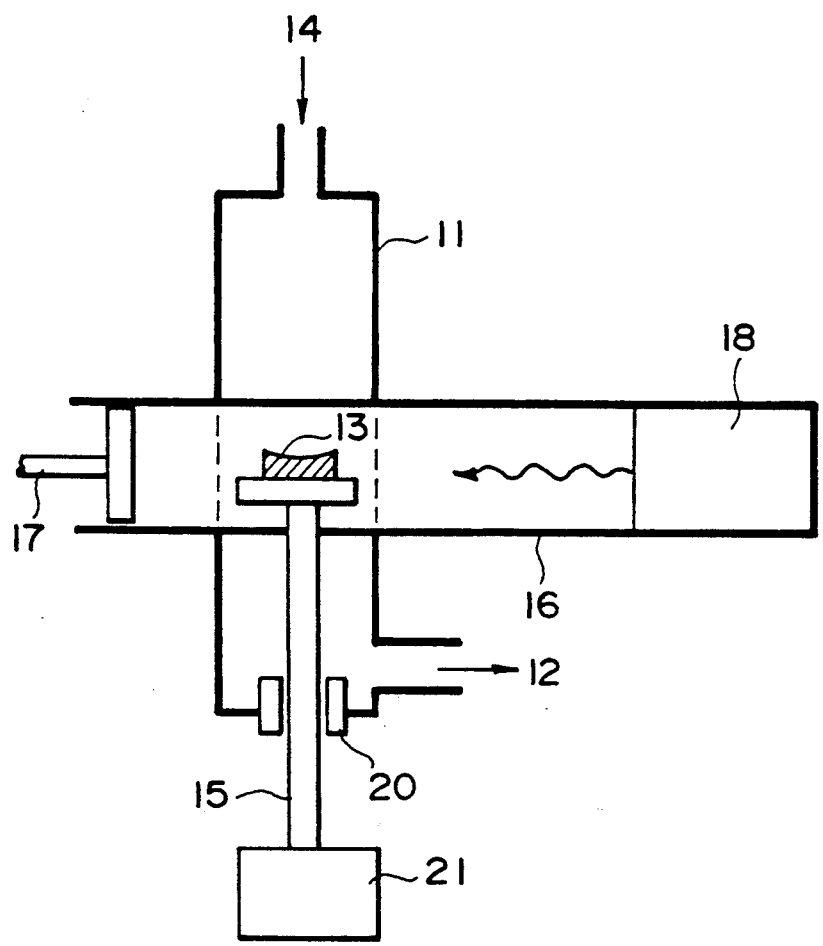
F I G. 4

DIAMOND CRYSTAL COATED MOLD FOR FORMING OPTICAL ELEMENTS

BACKGROUND OF THE INVENTION

1. Field of the Invention

This invention relates to a mold used for pressing glass material into glass optical products, such as lenses and prisms, and a method of producing such a mold.

2. Related Background Art

A recent lens manufacturing technique, in which lenses can be formed by pressing glass material without requiring polishing, has eliminated the complicated steps in conventional lens manufacturing methods and, at the same time, made it possible to manufacture lenses more easily and economically. In addition to lenses, the techniques has come to be used for the production of other glass optical elements, such as prisms or the like.

The material of such a mold, used for pressing glass material into glass optical elements, is required to excel in hardness, heat resistance, mold release and mirror-finish characteristics, etc. Regarding metals or ceramics as the material for this type of a mold and molds coated with said materials, an number of proposals have been made in, for example, Japanese Patent Laid-Open Application Nos. 49-5112, 52-45613, and 60-246230. However, these molds and coating materials are liable to be subject to oxidation or to be fused to, or generate fogging on, the surface of the glass object to be molded. Thus, they are unsuitable for use as mold material and coating material for optical glasses.

In view of this, there has recently been proposed a mold for forming glass products which is coated with diamond which is resistant to oxidation, has a high hardness and is not susceptible to chemical reaction with glass as compared with the materials (Japanese Patent Laid-Open Application Nos. 61-183134, 61-242922 and 1-301864). Although the diamond layer has excellent properties suitable for the coating layer of a mold, in many cases it does not adequately adhere to the base material. As a result of the change from room temperature to that for glass molding, it often happens that the diamond layer is lifted or separated from the mold base material. In extreme cases, the diamond layer formed on the base material at a temperature from about 800° C. to 1000° C., may be lifted and separated from the mold solely by cooling it down to room temperature. This is assumed to be attributable to the coefficient of linear expansion of diamond, which is one digit smaller than that of the mold base materials generally in use. In this regard, the diamond layers formed by ion beam sputtering, as disclosed in Japanese Patent Laid-Open Application Nos. 61-183134 and 61-242922, are no exception to the problem. The higher the quality of the diamond, i.e., the less the amount of the amorphous carbon constituent thereof, the more liable to be separated from the base material.

It is rare for a mixed coating layer of diamond, graphite and amorphous carbon to be separated from the mold (Japanese Patent Laid-Open Application No. 1-301864) as a result of temperature change. However, in the case of a film with much amorphous carbon constituent, in particular, the amorphous carbon wears out as the molding is repeated. The result is that only the diamond crystals conspicuously remain, thus making it impossible to retain the required level of surface precision, i.e., a maximum surface roughness of 200 Å.

SUMMARY OF THE INVENTION

It is accordingly a first object of this invention to provide a mold coated with a diamond layer which does not lift or separate from the mold base even if there is a change from a room temperature to a temperature for glass molding and which excels in adhesion to the mold base; and a method of producing the mold.

A second object of this invention is to provide a mold producing method by which diamond crystals can be deposited at high speed, thus providing a high productivity.

A third object of this invention is to provide a coated mold which is less liable to oxidize, fuse to or generate fogging on the glass surface; and a method of producing the mold.

A fourth object of this invention is to provide a mold which excels in hardness, heat resistance, mold release and mirror-finish characteristics, etc. and a method of producing the mold.

The present invention has been made with a view to solving the problem of the poor adhesion of the diamond layer to the mold base against the temperature change. In accordance with this invention, areas allowing deposition of diamond crystals and areas not allowing the same are formed on the surface of a mold for forming glass products so as to relieve the strain between diamond crystals and the mold base materials which is caused by temperature change, thereby improving the adhesion.

In accordance with this invention, there is provided: ① a mold for forming glass optical elements by press molding, comprising a mold base on which at least the molding surface is coated with diamond crystals in such a manner that no adjacent diamond crystal areas are in contact with each other; ② a method of producing a mold for forming glass optical elements by press molding, comprising the steps of: providing, at least on the molding surface of a mold base, areas where diamond crystals can be deposited and areas where no diamond crystals can be deposited upon applying a gas phase method to the molding surface, and selectively depositing diamond crystals by the gas phase method, whereby no adjacent diamond crystal areas are in contact with each other; ③ a method of producing a mold for forming glass optical elements, wherein areas where diamond crystals can be deposited and areas where no diamond crystals can be deposited upon applying a gas phase method are formed by patterning in such a manner that no adjacent areas of diamond crystal deposition are in contact with each other; and ④ a method of producing a mold for forming glass optical elements, wherein the surface of the mold is polished when the surface roughness of the deposited diamond crystal layer does not adequately satisfy the surface precision required of a such a mold.

Further, in accordance with this invention, there is provided: ① a mold for forming glass optical elements by press molding, comprising a mold base on which at least the molding surface is coated with a layer consisting essentially of a coexistent phase of diamond crystals and amorphous carbon; ② a method of producing a mold for forming glass optical elements by press molding, wherein at least the molding surface of a mold base is coated by a gas phase method with a layer of a coexistent phase of diamond crystals and amorphous carbon; and ③ a method of producing a mold for forming optical elements, wherein the mold surface is polished when the surface roughness of the deposited layer of the coexistent phase of diamond crystals and amorphous carbon does not adequately satisfy the surface precision required of a such a mold.

In the present invention, the formation of the diamond layer is effected by a well-known diamond layer forming method, such as the microwave plasma CVD method, the high-frequency plasma CVD method, the DC-current plasma CVD method, the DC-arc heat plasma CVD method, the high-frequency heat plasma CVD method, the burning flame method, the heat filament method, the electron assist plasma CVD method, etc.

When forming a diamond layer by an apparatus using such methods, a gas containing carbon is used as a raw material. This gas is mixed with other gases, such as hydrogen, oxygen, helium, neon, argon, xenon, etc. Examples of carbon-containing substances include: saturated hydrocarbons such as methane, ethane, propane, and adamantane; unsaturated hydrocarbons such as benzene and naphthalene or hydrogen-atom-substitution products thereof; alcohols such as methanol and ethanol; oxides such as carbon monoxide and carbon dioxide; aldehydes such as acetaldehyde and formaldehyde; carboxylic acids such as formic acid and acetic acid; ketones such as acetone and diethyl ketone; and ethers such as methyl ether and ethyl ether. Among these carbon-containing substances, those which are gaseous at room temperature are introduced as they are from their container into the layer formation chamber, whereas those which are in the liquid or solid form at room temperature are introduced into the layer formation chamber after being gasified by bubbling or heating.

When depositing a diamond layer by one of the abovementioned diamond deposition methods, the rate at which the diamond is deposited varies greatly depending on the concentration of the carbon in the carbon-containing substance used. Generally speaking, the higher the concentration of the carbon in the carbon-containing substance, the larger the amount of amorphous carbon and graphite in the resulting diamond layer. The way the amorphous carbon and graphite exist in the diamond layer will be described below. First, it should be noted that it is rare for amorphous carbon and graphite to exist within a single diamond crystal. The graphite exists in the form of microcrystals or crystal whiskers, which are wrapped in amorphous carbon. Further, amorphous carbon also exists in spaces between diamond crystals. That is, the diamond crystals and the graphite crystals form separately, with the amorphous carbon filling the spaces therebetween.

Various types of diamond layers were examined for the influence of their graphite and amorphous carbon constituents on the glass molding process. The results of the examination showed that lumps of graphite and amorphous carbon increases the reactivity between the diamond layer and the glass during molding, resulting in a deterioration of the diamond layer by the molding process. Thus, the existence of such lumps is undesirable. However, it was also found that the existence of the amorphous carbon between the diamond crystal particles does not affect the molding process in any way. Further, it was found that, even if the concentration of the carbon-containing substance is increased, the selective deposition method for single crystal described above helps to reduce the probability of forming lumps of graphite and amorphous carbon, thus making it possible to produce a diamond layer in which amorphous carbon exists only between the diamond particles. This may be illustrated in FIG. 7, which is a schematic diagram based on an SEM photograph. In FIG. 7, the reference numerals 9 and 10 indicate diamond particles and amorphous carbon. respectively. Thus, by this selective deposition method, a diamond layer can be produced at a high deposition rate while scarcely affecting the molding process.

The present invention will now be described in detail.

The coefficient of linear expansion of diamond at room temperature is $1 \times 10^{-6}$, nearly one digit smaller than that of ordinary substances. Accordingly, the diamond layer on a diamond-coated mold may easily separate from the mold base because of temperature change. The problem resulting from this difference in coefficient of linear expansion will be considered below with reference to an actually used type of mold which is typical in terms of size, coefficient of expansion, and molding temperature. For example, assuming a mold base having a coefficient of linear expansion of $1 \times 10^{-5}$ and an area of 10 mm$^2$ is coated with diamond crystals, a change from room temperature to 1000° C. causes the area corresponding to the mold base to 11 mm$^2$ and the area corresponding to the diamond crystal layer to 10.1 mm$^2$. This difference of about 1 mm$^2$ constitutes an important factor causing the diamond crystal layer to separate from the mold base.

In accordance with the present invention, two or more areas, which are relatively small as compared to the surface area of the mold base, are provided on the mold base surface. On these areas, diamond crystals are selectively deposited in order that the discrepancy in size between the mold base and diamond crystals may be dispersed by virtue of the spaces between the areas of the diamond crystal deposition, thereby improving the adhesion between the mold base and the diamond crystals. It goes without saying that this method for improving the adhesion between the mold base and the diamond crystals as described above, is effective not only in the mold, but also in the system where a large temperature change is involved.

A selective deposition method will be described below with reference to a specific example. The selective deposition of the diamond crystals can be effected by providing areas where diamond crystals can grow with ease and areas where it is difficult for them to grow on a mold base.

FIGS. 1A through 1F show one example. First, a mold base 5 is subjected to ultrasonic processing in an organic solvent containing diamond abrasive grains in order that the nucleus formation density on the mold base 5 may be increased, whereby scars are formed on the mold surface (FIG. 1A). Then, a resist 6 is applied to the mold surface (FIG. 1B), and a resist pattern is formed by electron beam lithography or the like (FIG. 1C). After that, the mold surface is etched by an Ar ion beam or the like so as to remove the scars in those portions where there is no resist (FIG. 1D). After removing the resist (FIG. 1E), diamond is deposited. As a result, diamond nuclei 7 are formed only in the portions where scars exist. Thus, diamond 8 is deposited as shown in FIG. 1F.

Further, there are other methods available. For example, fine particles of diamond may first by dispersed over the mold surface, and then a resist applied thereto form a resist pattern, thereby allowing diamond crystals to be deposited only in those portions where the resist exists. Or, surface irregularities may be formed by etching on the pattern by using an ion beam, a focused ion beam or the like, thereby allowing diamond crystals to be deposited only in the recess portions of the surface irregularities. Further, there is another method in which a patterned mask is placed on the mold base so as to deposit diamond crystals. Apart from the above, other methods are available which can be adopted where selective deposition of diamond is to be effected.

The pattern formed when effecting selective deposition may be of any configuration as long as it can fill the two-dimensional plane as a whole.

For example, as shown in FIG. 1G, circular areas with high nucleus formation density may be patterned on the lattice points of a square lattice, or, as shown in FIG. 1H, circular areas with high nucleus formation density may be patterned on the lattice points of a triangular lattice. Further, the lattice type and the configuration of the areas with high nucleus formation density are not limited to the above.

Further, it is not necessary for the pattern to be formed uniformly over the entire mold; it is also possible to form several different patterns on the surface of a single mold.

The substance referred to as "diamond crystals" mainly consists of diamond, which may include various lattice defects and (111) face stacking faults. In any case, its structure is basically a cubic crystal diamond. The diamond crystals on the selective deposition unit may be monocrystalline (here, (111) face twin crystals are regarded as monocrystals) or polycrystalline. Amorphous phase carbon may also exist in boundary areas between crystals and on the surface of each monocrystal as well as in the diamond structure. The lattice defects and the amorphous phase carbon may contain elements other than carbon. It is desirable, however, that the total amount of these impurity atoms be 0.1% or less in atomic number. A larger quantity of such atoms will lead to an unstable diamond structure.

When depositing diamond crystals by the above method, the deposition is stopped just before a majority of diamond crystals on adjacent diamond growth areas (hereinafter referred to as "selective deposition units") have come into contact with each other. That is, the deposition is stopped before the diamond crystals on adjacent selective deposition units have been united with each other. However, partial unification of diamond crystals is acceptable.

The formation of the diamond layer is effected by a well-known diamond layer forming method, such as the microwave plasma CVD method, the high-frequency plasma CVD method, the DC-current plasma CVD method, the DC-arc heat plasma CVD method, the high-frequency heat plasma CVD method, the burning flame method, the heat filament method, the electron assist plasma CVD method, etc.

In the formation of a diamond layer by such methods, a gas containing carbon is used. This gas is mixed with other gases, such as hydrogen, oxygen, helium, neon, argon, xenon, etc. Examples of carbon-containing substances include: saturated hydrocarbons such as methane, ethane, propane, and adamantane; unsaturated hydrocarbons such as benzene and naphthalene or hydrogen-atom-substitution products thereof; alcohols such as methanol and ethanol; oxides such as carbon monoxide and carbon dioxide; aldehydes such as acetaldehyde and formaldehyde; carboxylic acids such as formic acid and acetic acid; ketones such as acetone and diethyl ketone; and ethers such as methyl ether and ethyl ether. Among these carbon-containing substances, those which are gaseous at room temperature are introduced as they are from their container into the layer formation chamber, whereas those which are in the liquid or solid form at room temperature are introduced into the layer formation chamber after being gasified by bubbling or heating.

If the surface of the diamond layer on an optical element mold is so rough as to be unsuitable for optical elements, the surface has to be polished. The polishing is performed by using diamond powder, which is dissolved in an appropriate solvent, and a metal plate with or without diamond powder embedded therein. The solvent for dissolving the diamond powder may be water or a polishing oil. The metal plate may consist of copper, iron, nickel, cobalt, or aluminum, or an alloy thereof. The diamond layer is polished by bringing the metal plate and the mold into contact with each other while rotating them both. In order to increase the speed at which the polycrystalline diamond layer is polished, the metal plate may be heated, or a polishing atmosphere gas such as hydrogen, oxygen, helium, neon, argon, xenon, nitrogen, carbon monoxide, carbon dioxide, nitrogen suboxide, nitrogen dioxide, etc. may be used. The method of polishing the diamond layer is not limited to the above and other polishing methods may also be acceptable.

BRIEF DESCRIPTION OF THE DRAWINGS

FIG. 1A to 1H are schematic diagrams showing an example of the selective deposition process and examples of the patterning of areas with high nucleus formation density (selective deposition units);

FIGS. 2 and 3 are sectional views showing an embodiment of the optical element forming mold of this invention, of which:

FIG. 2 shows the condition before press molding; and

FIG. 3 shows the condition after press molding;

FIG. 4 shows a microwave CVD apparatus for coating the surface of a mold base with a polycrystalline diamond layer;

DESCRIPTION OF THE PREFERRED EMBODIMENTS

Figure 1A:
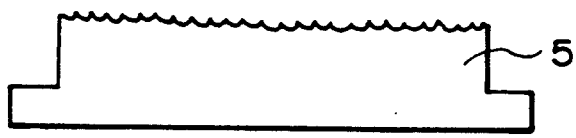
Figure 1B:
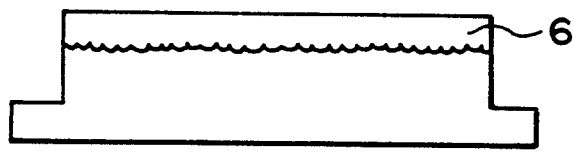
Figure 1C:
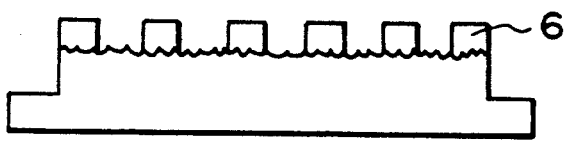
Figure 1D:
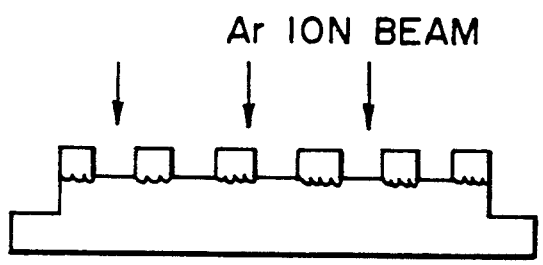
Figure 1E:
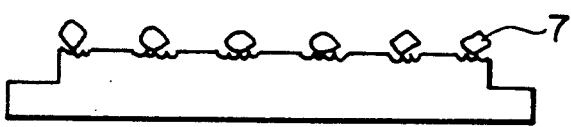
Figure 1F:
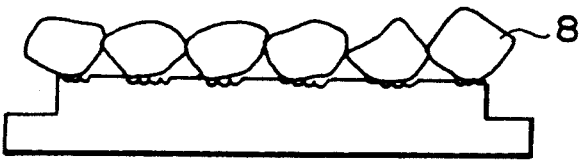

The method of producing a glass-optical-element forming mold in accordance with this invention and the results obtained by using this mold will now be described with reference to specific examples.

Example 1

FIGS. 2 and 3 show an embodiment of the mold of this invention. In the drawings, the reference numeral 1 indicates mold bases formed of a heat resistant and pressure proof material, such as cemented carbide, and the reference numeral 2 indicates polycrystalline diamond layers formed on the molding surfaces of these mold bases, i.e., those surfaces which are to be brought into contact with the glass material.

FIG. 2 shows the condition before a glass optical element is formed by press molding, and FIG. 3 shows the condition after that. The glass material 3 placed between the molds as shown in FIG. 2 is formed into an optical element 4, such as a lens, by press molding, as shown in FIG. 3.

First, a concave mold formed of $Si_3N_4$ and having a diameter of 35 mm and a radius of curvature of 45 mm was subjected to ultrasonic processing for two hours in ethanol containing diamond abrasive grains having an average grain size of 20 μm. Afterwards, the mold was subjected to ultrasonic cleaning in ethanol, and then, in acetone, each for 10 minutes, and was then sufficiently dried in atmospheric air. After forming a resist pattern consisting of circles each having a diameter of 0.8 μm on the lattice points of a lattice measuring 2 μm², the mold surface was etched 5000 Å by using an Ar ion beam. In this process, only those portions that were not covered with the resist were etched, and upon depositing diamond on the mold surface after removing the resist, diamond crystals grew only in those portions which had been covered with the resist, thus making it possible to effect a selective deposition. The mold base 13 from which resist had been removed was placed on a mold holder 15 in the microwave CVD apparatus shown in FIG. 4. In order to effect uniform deposition of diamond crystals on the mold, the apparatus is so designed that the shaft of this mold holder 15 extends through an air bearing 20 of a vacuum chamber 11 and is connected with a motor 21 arranged on the outside. With this mechanism, the mold holder 15 was rotated at reduced pressure at a rate of two rotations per minute.

Subsequently, air was evacuated from the inner space of the vacuum chamber 11 by means of a mechanical booster pump and a rotary pump (none of which are shown) through an air outlet 12, thereby raising the degree of vacuum in the vacuum chamber up to a level of $2 \times 10^{-3}$ Torr. The end stages of these pumps are connected in their turn to a gas removing apparatus (not shown), whereby the exhaust gas generated during the layer formation is discharged into the atmosphere. There may be provided only one or more than one inlet 14 for the material gas. This material gas line is connected to a mass flow control system and a gas container (none of which are shown), and it is possible to flow only one type of gas or two or more types of gas. Further, it is also possible to flow a mixed gas consisting of two or more types of gas. $CH_4$ and $H_2$ gases were introduced in a mixed state into the vacuum chamber 11 through a gas inlet 14 at a flow rate of 2 SCCM and 200 SCCM, respectively, and, by appropriately adjusting a plunger 17 and a sleestab 18 connected to a power source section (not shown), plasma was generated at the position of the mold. The reference numeral 16 indicates a waveguide. Under the conditions of a 2.45 GHz microwave output of 1500 W, a pressure of 200 Torr, and no mold heating, deposition was effected for two hours to form a 2 μm thick layer. The mold temperature during the layer formation was 850° C. to 870° C.

Figure 5:
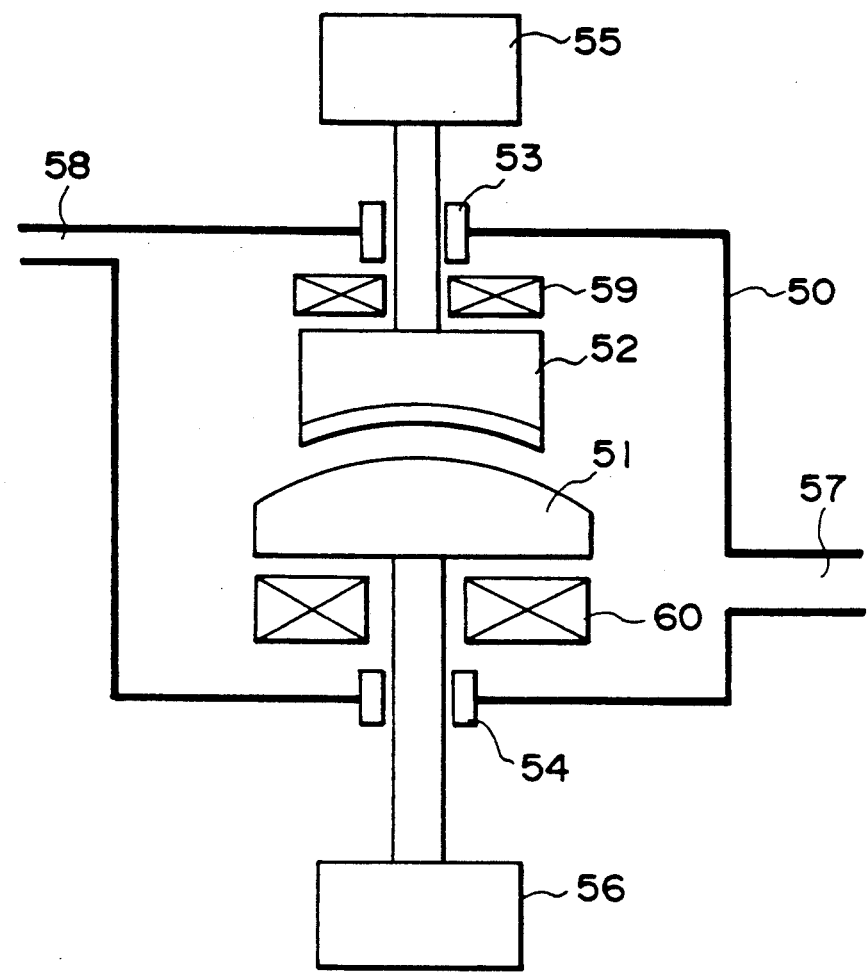
FIG. 5 shows a polishing apparatus.

The mold 1 coated with the 2 μm thick polycrystalline diamond layer was taken out of the vacuum chamber and placed on a mold holder 52 in the polishing apparatus 50 shown in FIG. 5. After evacuating air from the inner space of the polishing apparatus 50 through an air outlet 57 to a vacuum degree of $3 \times 10^{-3}$ Torr, hydrogen gas was introduced into the polishing apparatus 50 through a gas inlet 58 at a flow rate of 100 SCCM. An iron plate 51 containing diamond powder having an average grain size of 1 μm was rotated with the mold holder 52 at a speed of 500 rpm by means of air bearings 53 and 54 and motors 55 and 56. The surface portion of the iron plate was formed as a convex surface having a diameter of 80 mm and a radius of curvature of 45 mm. The surface roughness of the mold after polishing ten hours was Rmax 250 Å.

From SEM observation, the average grain size of the diamond particles on the mold was about 2 μm. On Raman spectrum measurement of the diamond layer, only an acute peak of 1333 $cm^{-1}$ was observed. On reflective electron beam analysis, only diamond was observed. It was found from these results that the layer on the mold consisted of diamond. Further, on elemental analysis of the layer, no elements other than carbon atoms were to be found.

Figure 6:
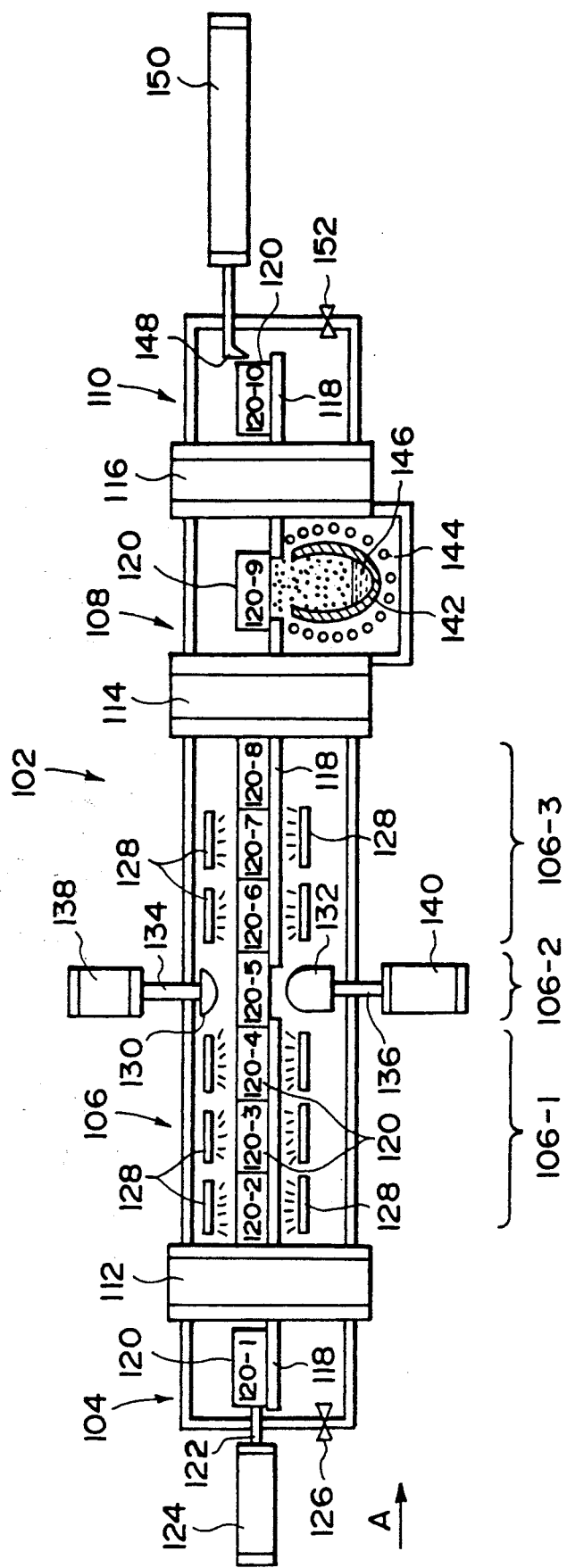
FIG. 6 is a sectional view showing a lens forming apparatus in which an optical element forming mold is used.

Subsequently, the press molding of a glass lens was performed by using this mold. FIG. 6 shows the molding apparatus used, which includes a molding device 102, an intake replacement chamber 104, a molding chamber 106, a deposition chamber 108, a release replacement chamber 110, gate valves 112, 114 and 116, a rail 118, and pallets 120 adapted to be fed in the direction of the arrow A on the rail 118. The apparatus further includes cylinders 124, 138, 140 and 150, valves 126 and 152, and heaters 128 which are arranged in the molding chamber 106 along the rail 118.

The molding chamber 106 is divided into three zones: a heating zone 106-1, a press zone 106-2, and a slow cooling zone 106-3. These zones are arranged in the direction in which the pallets are fed. In the press zone 106-2, an upper mold member 130 is fixed to the lower end of the rod 134 of the cylinder 138, and a lower mold member 132 is fixed to the upper end of the rod 136 of the cylinder 140. These upper and lower mold members 130 and 132 consist of molds formed in accordance with this invention as illustrated in FIG. 1. Arranged in the deposition chamber 108 are a container 142 containing a deposition substance 146 and a heater 144 for heating this container.

An optical glass SF14 (manufactured by Hoya) of a softening point Sp of 586° C. and a glass transition point Tg of 485° C. was formed into a predetermined configuration to obtain a blank for molding.

The glass blank was placed on a pallet 120 and set in the position 120-1 in the intake replacement chamber 104, and the pallet in this position was pushed in the direction A so as to convey it to the position 102-2 in the molding chamber 106. Then, in the like manner, pallets, each with a new glass blank, were successively set in the intake replacement chamber 104 with a predetermined timing, each pallet being successively fed from the position 120-2 to the position 120-8 in the molding chamber 106. Meanwhile, the heaters 128 gradually heated the glass blanks to a temperature above their softening point before they reached the position 120-4. The glass blanks were then fed to the press zone 106-2, where the cylinders 138 and 140 were operated to cause the upper and lower mold members 130 and 132 to perform molding at a pressure of 10 kg/cm² for five minutes. After each pressing, the pressure was canceled, with the temperature being lowered down to a level below the glass transition point. Then, the cylinders 138 and 140 were operated to release the upper and lower mold members 130 and 132 from the molded glass product. In effecting the press molding, the above pallets were used as drum members for molding. The molded glass products were gradually cooled in the slow cooling zone 106-3. The molding chamber 106 was filled with nitrogen gas.

Each pallet, which had reached the position 120-8 in the molding chamber 106, was fed in the next feeding step beyond the gate valve 114 to the position 120-9 in the deposition chamber 108, then, beyond the gate valve 116 to the position 120-10 in the release replacement chamber 110. Then, in the next feeding step, the cylinder 150 was operated to extract the molded glass object from the molding apparatus 102 by means of the rod 148.

Table 1 shows the surface roughness of the lens and mold after performing molding 5000 times successively along with their surface roughness after performing molding 100 times and 1000 times. After performing molding 5000 times, the surface roughness of the mold had been slightly deteriorated, whereas there was no change in the surface roughness of the lens.

TABLE 1

| Number of times of molding | Surface roughness (Rmax/μm) | |
|---|---|---|
| | Lens | Mold |
| 100 | 0.030 | 0.025 |
| 1000 | 0.030 | 0.025 |
| 5000 | 0.030 | 0.027 |

Comparative Example 1

First, a concave mold formed of $Si_3N_4$ and having a diameter of 35 mm and a radius of curvature of 45 mm was subjected to ultrasonic processing for three hours in ethanol containing diamond abrasive grains having an average grain size of 30 μm. Afterwards, the mold was subjected to ultrasonic cleaning in ethanol, and then in acetone, for ten minutes each, and sufficiently dried in atmospheric air. This mold was placed on the holder 15 of the microwave CVD apparatus shown in FIG. 4, as in Example 1. The holder was rotated at a rate of two rotations per minute.

Subsequently, the degree of vacuum in the vacuum chamber 11 was increased up to a level of $2 \times 10^{-3}$ Torr. $CH_4$ and $H_2$ gases were introduced in a mixed state into the vacuum chamber 11 through the gas inlet 14 at a flow rate of 2 SCCM and 200 SCCM, respectively, and, by appropriately adjusting the plunger 17 and the sleestab 18, plasma was generated at the position of the mold. Under the conditions of a 2.45 GHz microwave output of 1500 W, a pressure of 200 Torr, and no mold heating, deposition was effected for two hours to form a 2 μm thick layer. Further, nine molds were coated with a diamond layer under the same conditions as those of the above mold, thus preparing ten molds in total. In eight of these molds, no layer separation occurred, whereas two of them suffered a layer separation of about 1 mm in the peripheral section.

Comparative Example 2

First, the same pattern for selective deposition as that of Example 1 was formed on a concave mold made of $Si_3N_4$ and having a diameter of 35 mm and a radius of curvature of 45 mm. This mold was placed on the holder 15 of the microwave CVD apparatus shown in FIG. 4. $CH_4$, $H_2$ and diborane gases were introduced in a mixed state into the vacuum chamber 11 through the gas inlet 14 at a flow rate of 2 SCCM, 200 SCCM, and 0.5 SCCM, respectively, generating plasma at the position of the mold. Under the conditions of a 2.45 GHz microwave output of 1500 W, a pressure of 200 Torr, and no mold heating, deposition was effected for two hours to form a 2 μm thick layer. The mold temperature during layer formation was 850° C. to 870° C.

The mold 1 taken out of the vacuum chamber 11 was placed in the mold holder 52 of the polishing apparatus 50 shown in FIG. 5. After evacuating air from the inner space of the polishing apparatus 50 through the air outlet 57 to a vacuum degree of $3 \times 10^{-3}$ Torr, hydrogen gas was introduced into the polishing apparatus 50 through the gas inlet 58 at a flow rate of 100 SCCM. An iron plate 51 containing a diamond powder having an average grain size of 10 μm was rotated with the mold holder 52 at a speed of 500 rpm by means of the air bearings 53 and 54 and the motors 55 and 56. The surface portion of the iron plate was formed as a convex surface having a diameter of 80 mm and a radius of curvature of 45 mm. On examination after polishing for one hour, the diamond layer was found to have been partially separated from the mold base, so the polishing was stopped.

Example 2

First, a concave mold formed of SiC and having a diameter of 25 mm and a radius of curvature of 45 mm was subjected to ultrasonic processing for two hours in ethanol containing diamond abrasive grains having an average grain size of 20 μm. Afterwards, the mold was subjected to ultrasonic cleaning in ethanol, and then, in acetone, each for 100 minutes, and sufficiently dried in atmospheric air. After forming a resist pattern consisting of circles each having a diameter of 0.8 μm on the lattice points of a triangular lattice one side of which measured 2 μm, the mold surface was etched 5000 Å by using an Ar ion beam. This mold was placed on the mold holder 15 of the microwave CVD apparatus which was the same as that used in Example 1. $C_2H_6$ and $H_2$ gases were introduced in a mixed state into the vacuum chamber 11 through the gas inlet 14 at a flow rate of 25 SCCM and 200 SCCM, respectively, and by appropriately adjusting the plunger 17 and the sleestab 18, plasma was generated at the position of the mold. Under the conditions of a 2.45 GHz microwave output of 1000 W, a pressure of 90 Torr, and no mold heating, deposition was effected for two hours to form 2 μm thick layer. The mold temperature during the layer formation was 800° C. to 900° C.

The mold 1 coated with the polycrystalline diamond layer 2 was taken out of the vacuum chamber 11 and placed on the mold holder 52 of the same polishing apparatus 50 as used in Example 1. After evacuating air from the inner space of the polishing apparatus 50 to a vacuum degree of $3 \times 10^{-3}$ Torr, oxygen gas was introduced into the polishing apparatus 50 through the gas inlet 58 at a flow rate of 200 SCCM. A copper plate 51 containing a diamond powder having an average grain size of 0.5 μm was rotated with the mold holder 52 at a speed of 600 rpm. The surface portion of the copper plate was formed as a convex surface having a diameter of 70 mm and a radius of curvature of 45 mm. The surface roughness of the mold after polishing twelve hours was Rma×250 Å.

From SEM observation, the average grain size of the diamond particles of the diamond layer on the mold was about 2 μm. On Raman spectrum measurement of the diamond layer, an acute peak of 1333 $cm^{-1}$ was observed. On reflective electron beam analysis, only diamond was observed. Further, on elemental analysis of the layer, no elements other than carbon atoms were to be found.

Then, by using this mold, an optical glass SF14 (manufactured by Hoya) of a softening point Sp of 586° C. and a glass transition point Tg of 485° C. was formed into a glass lens.

Table 2 shows the surface roughness of the lens and mold after performing molding successively 5000 times along with their surface roughness after performing molding 100 times and 1000 times.

TABLE 2

| Number of times | Surface roughness (Rmax/μm) | |
|---|---|---|
| of molding | lens | Mold |
| 100 | 0.028 | 0.025 |
| 1000 | 0.028 | 0.025 |
| 5000 | 0.028 | 0.025 |

Example 3

0.1 mg of diamond abrasive grains having an average grain size of 0.2 μm were dispersed over a flat mold mainly formed of WC, using TiC and TaC as binders, and having a diameter of 40 mm. A resist was applied to these diamond grains, forming a resist pattern consisting of squares having a side of 5 μm and spaced 1.5 μm from each other on the entire surface of the mold. This mold was placed on the mold holder 15 of the same microwave CVD apparatus as that in Example 1. The holder was rotated at a rate of one rotation per minute.

Then, the degree of vacuum in the vacuum chamber 11 was raised to a level of $2 \times 10^{-3}$ Torr. $C_2H_5OH$ (200 cc in total) was gasified through a bubbler and introduced into the vacuum chamber 11 through the gas inlet 14 along with hydrogen gas (at a flow rate of 200 SCCM), and, by appropriately adjusting the plunger 17 and the sleestab 18, plasma was generated at the position of the mold. Under the conditions of a 2.45 GHz microwave output of 1000 W, a pressure of 90 Torr, and no mold heating, deposition was effected for 30 minutes to form a 2 μm thick layer. The mold temperature during the layer formation was 800° C. to 820° C.

The mold 1 coated with the polycrystalline diamond layer 2 was taken out of the vacuum chamber 11 and placed on the mold holder 52 of the same polishing apparatus 50 as that in Example 1. After evacuating air from the inner space of the polishing apparatus 50 to a vacuum degree of $3 \times 10^{-3}$ Torr, argon gas was introduced into the polishing apparatus 50 through the gas inlet 58 at a flow rate of 10 SCCM. An Ni plate 51 containing a diamond powder having an average grain size of 0.5 μm was rotated with the mold holder 52 at a speed of 600 rpm. The surface portion of the Ni plate was formed as a flat surface having a diameter of 50 mm. The surface roughness of the mold after polishing twenty hours was Rmax×200 Å.

On Raman spectrum measurement of the diamond layer on the mold, an acute peak of 1333 cm$^{-1}$ and a broad peak of 1580 cm$^{-1}$ were observed. On reflective electron beam analysis, only diamond was observed. From these results, it was found that the layer on the mold consisted of diamond and amorphous carbon. Further, on elemental analysis of the layer, no elements other than carbon atoms were to be found.

Then, by using this mold, an optical glass PSK2 (manufactured by Hoya) of a softening point Sp of 650° C. and a glass transition point Tg of 600° C. was formed into a glass lens in the same way as in Example 1.

Molding was performed 5000 times successively, sampling 100 glass plates at each 100th molding to measure them for surface roughness. The average surface roughness after molding 5000 times was Rmax×250 Å.

Example 4

0.1 mg of diamond abrasive grains having an average grain size of 0.2 μm were dispersed over a flat mold consisting of 90% of WC and 10% of Co and having a diameter of 40 mm. A resist was then applied to these diamond grains, forming a resist pattern consisting of equilateral triangles over the entire surface of the mold. One side of each equilateral triangle measured 5 μm and each two adjacent sides thereof were spaced 1.5 μm from each other. This mold was placed on the mold holder 15 of the same microwave CVD apparatus as that used in Example 1. The holder was rotated at a rate of one rotation per minute. Acetone (300 cc in total) was gasified through a bubbler and introduced into the vacuum chamber 11 through the gas inlet 14 along with hydrogen gas (at a flow rate of 200 SCCM), and, by appropriately adjusting the plunger 17 and the sleestab 18, plasma was generated at the position of the mold. Under the conditions of a 2.45 GHz microwave output of 800 W, a pressure of 100 Torr, and no mold heating, deposition was effected for five minutes to form a 2 μm thick layer. The mold temperature during the layer formation was 800° C. to 820° C.

The mold 1 coated with the polycrystalline diamond layer 2 was taken out of the vacuum chamber 11 and placed on the mold holder 52 of the same polishing apparatus 50 as used in Example 1. After evacuating air from the inner space of the polishing apparatus 50 to a vacuum degree of $3 \times 10^{-3}$ Torr, hydrogen gas was introduced into the polishing apparatus 50 through the gas inlet 58 at a flow rate of 10 SCCM. A Co plate 51 containing a diamond powder having an average grain size of 0.2 μm was rotated with the mold holder 52 at a speed of 600 rpm. The surface portion of the Co plate was formed as a flat surface having a diameter of 50 mm. The surface roughness of the mold after polishing 15 hours was Rmax×200 Å.

On Raman spectrum measurement of the diamond layer on the mold, an acute peak of 1333 cm$^{-1}$ and a broad peak of 1580 cm$^{-1}$ were observed. On reflective electron beam analysis, only diamond was observed. From these results, it was found that the layer on the mold consisted of diamond and amorphous carbon. Further, on elemental analysis of the layer, no elements other than carbon atoms were to be found.

Then, by using this mold, an optical glass FSK2 (manufactured by Hoya) of a softening point Sp of 490° C. and a glass transition point Tg of 465° C. was formed into a glass lens in the same way as in Example 1.

Molding was performed 5000 times successively, sampling 100 glass plates at each 100th molding to measure them for surface roughness. The average surface roughness after molding 5000 times was Rmax×230 Å.

Example 5

A resist was applied to a convex mold formed of alumina and having a diameter of 25 mm and a radius of curvature of 45 mm, forming a resist pattern consisting of circles each having a diameter of 0.5 μm on the triangular lattice points of a lattice interval of 2 μm. Etching was performed 0.3 μm deep by means of an Ar ion beam of an acceleration voltage of 500 eV. After removing the resist, this mold was placed on a mold holder 15 in a well-known direct current CVD apparatus. Ethyl ether (250 cc in total) was gasified through a bubbler and introduced into the vacuum chamber 11 through the gas inlet 14 along with hydrogen gas (at a flow rate of 200 SCCM), and, under the conditions of a direct current of 3000 V, inter-electrode spacing of 15 mm, a pressure of 100 Torr, and no mold heating, deposition was effected for thirty minutes to form a 2 μm thick layer. The mold temperature during the layer formation was 820° C. to 840° C.

The mold 1 coated with the polycrystalline diamond layer 2 was taken out of the vacuum chamber 11 and placed on the mold holder 52 of the same polishing apparatus 50 as used in Example 1. After evacuating air from the inner space of the polishing apparatus 50 to a vacuum degree of $3 \times 10^{-3}$ Torr, hydrogen gas was introduced into the polishing apparatus 50 through the gas inlet 58 at a flow rate of 10 SCCM. An Fe plate 51 containing a diamond powder having an average grain size of 0.5 μm was rotated with the mold holder 52 at a speed of 600 rpm. The surface portion of the Fe plate was formed as a concave surface having a diameter of 50 mm and a radius of curvature of 45 mm. The surface roughness of the mold after polishing ten hours was Rmax 220 Å.

On SEM observation of the diamond layer on the mold, the grain size of the diamond was above 2 μm. On Raman spectrum measurement of the diamond layer on the mold, an acute peak of 1333 cm$^{-1}$ was observed. On reflective electron beam analysis, only diamond was observed. Further, on elemental analysis of the layer, no elements other than carbon atoms were to be found.

Then, by using this mold, a glass material BK7 (manufactured by Hoya) of a softening point Sp of 630° C. and a glass transition point Tg of 565° C. was pressed into a glass lens in the same way as in Example 1.

Molding was performed 5000 times successively, sampling 100 glass plates at each 100th molding to measure them for surface roughness. The average surface roughness after molding 5000 times was Rmax 260 Å.

Example 6

A resist was applied to a concave mold formed of $SiO_2$ and having a diameter of 35 mm to form a resist pattern consisting of circles each having a diameter of 1 μm on triangular lattice points of a lattice interval of 3 μm. Etching was performed 0.1 μm deep by means of an Au focused ion beam. After removing the resist, this mold was placed on a mold holder 15 in a well-known high-frequency CVD apparatus of 13.65 MHz. Then the degree of vacuum in the vacuum chamber was raised to a level of $2 \times 10^{-3}$ Torr. Acetaldehyde (200 cc in total) was gasified through a bubbler and introduced into the vacuum chamber 11 through the gas inlet 14 along with hydrogen gas (at a flow rate of 200 SCCM), and, under the conditions of a high-frequency output of 800 W, an inter-electrode spacing of 15 mm, a pressure of 30 Torr, and no mold heating, deposition was effected for ten minutes to form a 3 μm thick layer. The mold temperature during the layer formation was 850° C. to 870° C.

The mold 1 coated with the polycrystalline diamond layer 2 was taken out of the vacuum chamber 11 and placed on the mold holder 52 in the same polishing apparatus 50 as used in Example 1. An Fe plate 51 was rotated with the mold holder 52 at a speed of 600 rpm while flowing an aqueous solution containing a diamond powder having an average grain size of 10 μm over the Fe plate. The surface portion of the Fe plate was formed as a concave surface having a diameter of 90 mm and a radius of curvature of 45 mm. The surface roughness of the mold after polishing twenty hours was Rmax 270 Å.

On observing the SEM image of the diamond layer on the mold, the average grain size of the diamond was about 2 μm. On Raman spectrum measurement of the diamond layer on the mold, an acute peak of 1333 cm$^{-1}$ was observed. On reflective electron beam analysis, only diamond was observed. Further, on elemental analysis of the layer, no elements other than carbon atoms were to be found. Then, by using this mold, a glass material K7 (manufactured by Hoya) of a softening point Sp of 595° C. and a glass transition point Tg of 525° C. was pressed into a glass lens in the same way as in Example 1.

Molding was performed 5000 times successively, sampling 100 glass plates at each 100th molding to measure them for surface roughness. The average surface roughness after molding 5000 times was Rmax 290 Å.

Example 7

A concave mold formed of $ZrO_2$ and having a diameter of 35 mm and a radius of curvature of 45 mm was subjected to ultrasonic processing for two hours in ethanol containing diamond abrasive grains having an average grain size of 20 μm. Afterwards, the mold was subjected to an ultrasonic cleaning in ethanol, and then, in acetone, each for ten minutes and sufficiently dried in atmospheric air. A resist pattern consisting of squares with a side of 8 μm was formed on square lattice points of a lattice interval of 10 μm. This mold was set in an Ar ion beam apparatus of an acceleration voltage of 500 V, in which those portions of the mold where no resist had been applied were etched 5000 Å. After removing the resist, this mold was placed on a mold holder 15 in a well-known high-frequency CVD apparatus of 13.65 MHz. Acetic acid (200 cc in total) was gasified through a bubbler and introduced into the vacuum chamber 11 through the gas inlet 14 along with hydrogen gas (at a flow rate of 200 SCCM), and, under the conditions of a high-frequency output of 900 W, an inter-electrode spacing of 15 mm, a pressure of 30 Torr, and no mold heating, deposition was effected for thirty minutes to form a 2 μm thick layer. The mold temperature during the layer formation was 840° C. to 860 ° C.

The mold 1 coated with the polycrystalline diamond layer 2 was taken out of the vacuum chamber 11 and placed on the mold holder 52 in the polishing apparatus 50 which was the same as that used in Example 6. A copper plate 51 was rotated with the mold holder 52 at a speed of 600 rpm while flowing a polishing oil containing a diamond powder having an average grain size of 0.5 μm over the copper plate. The surface portion of the copper plate was formed as a convex surface having a diameter of 90 mm and a radius of curvature of 45 mm. The surface roughness of the mold after polishing twenty hours was Rmax 250 Å.

On Raman spectrum measurement of the diamond layer on the mold, an acute peak of 1333 cm$^{-1}$ and a broad peak of 1580 cm$^{-1}$ were observed. On reflective electron beam analysis, only diamond was observed. From these results, it was found that the layer on the mold consisted of diamond and amorphous carbon. Further, on elemental analysis of the layer, no elements other than carbon atoms were to be found.

Then, by using this mold, a glass material SK5 (manufactured by Hoya) of a softening point Sp of 700° C. and a glass transition point Tg of 655° C. was pressed into a glass lens in the same way as in Example 1.

Molding was performed 5000 times successively, sampling 100 glass plates at each 100th molding to measure them for surface roughness. The average surface roughness after molding 5000 times was Rma×270 Å.

Example 8

A concave mold formed of TaC and having a diameter of 35 mm and a radius of curvature of 45 mm was subjected to ultrasonic processing for two hours in ethanol containing diamond abrasive grains. Afterwards, the mold was subjected to ultrasonic cleaning in ethanol, and then, in acetone, each for ten minutes and sufficiently dried in atmospheric air. A resist pattern in which squares with a side of 90 μm were spread all over was formed on square lattice points of a lattice interval of 100 μm. This mold was set in an Ar ion beam apparatus of an acceleration voltage of 500 V, in which those portions of the mold where no resist had been applied were etched 5000 Å. After removing the resist, this mold was placed on a mold holder 15 in a well-known DC plasma jet apparatus. Then, the degree of vacuum in the vacuum chamber 11 of the apparatus was raised to a level of $2\times10^{-3}$ Torr. Acetylene and hydrogen were introduced into the vacuum chamber 11 through the gas inlet 14 each at a flow rate of 200 SCCM, and, under the conditions of an applied voltage of 1000 V and a pressure of 100 Torr, deposition was effected for forty minutes to form a 100 μm thick layer. The mold temperature during the layer formation was 1000° C. to 1200° C.

The mold 1 coated with the polycrystalline diamond layer 2 was taken out of the vacuum chamber 11 and placed on the mold holder 52 in the same polishing apparatus 50 as used in Example 1. After evacuating air from the polishing apparatus 50 to a vacuum degree of $3\times10^{-3}$ Torr, hydrogen gas was introduced into the polishing apparatus 50 through the gas inlet 58 at a flow rate of 100 SCCM. A Co plate 51 containing a diamond powder having an average grain size of 0.5 μm was rotated with the mold holder 52 at a speed of 600 rpm. In this process, heaters 59 and 60 were utilized to heat the Co plate up to a temperature of 900° C. The surface portion of the Co plate was formed as a convexo-plane having a diameter of 80 mm and a radius of curvature of 45 mm. The surface roughness of the mold after polishing five hours was Rma×180 Å.

On Raman spectrum measurement of the diamond layer on the mold, an acute peak of 1333 cm$^{-1}$ and a broad peak of 1580 cm$^{-1}$ were observed. On reflective electron beam analysis, only diamond was observed. From these results, it was found that the layer on the mold consisted of diamond and amorphous carbon. Further, on elemental analysis of the layer, no elements other than carbon atoms were to be found.

Then, by using this mold, a glass material LaF20 (manufactured by Hoya) of a softening point Sp of 680° C. and a glass transition point Tg of 640° C. was pressed into a glass lens in the same way as in Example 1.

Molding was performed 5000 times successively, sampling 100 glass plates at each 100th molding to measure them for surface roughness. The average surface roughness after molding 5000 times was Rma×200 Å.

Example 9

A flat mold formed of cermet and having a diameter of 5 mm was subjected to ultrasonic processing for two hours in ethanol containing diamond abrasive grains having an average grain size of 20 μm. Afterwards, the mold was subjected to ultrasonic cleaning in ethanol, and then, in acetone, each for ten minutes and sufficiently dried in atmospheric air. A resist pattern in which squares with a side of 48 μm were spread all over was formed on square lattice points of a lattice interval of 50 μm. This mold was set in an ion beam apparatus of an acceleration voltage of 500 V, in which those portions of the mold where no resist had been applied were etched 5000 Å by means of an Ar ion beam. After removing the resist, this mold was placed on a mold holder 15 in a well-known electron assist plasma apparatus. Then, the degree of vacuum in the vacuum chamber 11 of the apparatus was raised to a level of $2\times10^{-3}$ Torr. Adamantane was sublimated by heat and introduced into the vacuum chamber 11 through the gas inlet 14. Hydrogen was flowed at a flow rate of 200 SCCM, and, under the conditions of a filament temperature of 2100° C., an inter-electrode spacing of 15 mm, a substrate bias voltage of −200 V, and a pressure of 130 Torr, deposition was effected for twenty minutes to form a 2 μm thick layer. The mold temperature during the layer formation was 900° C. to 910° C.

The mold 1 coated with the polycrystalline diamond layer 2 was taken out of the vacuum chamber 11 and placed on the mold holder 52 of the same polishing apparatus 50 as used in Example 1. After evacuating air from the polishing apparatus 50 to a vacuum degree of $3\times10^{-3}$ Torr, hydrogen gas was introduced into the polishing apparatus 50 through the gas inlet 58 at a flow rate of 100 SCCM. An Fe plate 51 containing a diamond powder having an average grain size of 0.5 μm was rotated with the mold holder 52 at a speed of 600 rpm. In this process, heaters 59 and 60 were utilized to heat the Fe plate 51 up to a temperature of 950° C. The surface portion of the Fe plate was formed as a flat surface having a diameter of 80 mm. The surface roughness of the mold after polishing five hours was Rma×190 Å. On Raman spectrum measurement of the diamond layer on the mold, an acute peak of 1333 cm$^{-1}$ and a broad peak of 1580 cm$^{-1}$ were observed. On reflective electron beam analysis, only diamond was observed. From these results, it was found that the layer on the mold consisted of diamond and amorphous carbon. Further, on elemental analysis of the layer, no elements other than carbon atoms were to be found.

Then, by using this mold, a glass material KF6 (manufactured by Hoya) of a softening point Sp of 470° C. and a glass transition point Tg of 420° C. was pressed into a glass lens in the same way as in Example 1.

Molding was performed 5000 times successively, sampling 100 glass plates at each 100th molding to measure them for surface roughness. The average surface roughness after molding 5000 times was Rma×215 Å.

Example 10

A flat mold formed of SiC sintered compact and having a diameter of 5 mm was set in an ion beam apparatus of an acceleration voltage of 1000 V, in which a polycrystalline diamond target was sputtered 20 hours by means of an Ar ion beam to embed diamond cluster in the SiC mold surface. Afterwards, a resist pattern in which squares with a side of 48 μm were spread all over was formed on square lattice points of a lattice interval of 50 μm. This mold was set in an ion beam apparatus, in which those portions where no resist had been applied were etched 1 μm by means of an Ar ion beam of an acceleration voltage of 500 V. After removing the resist, this mold was placed on a mold holder 15 in a well-known electron assist plasma apparatus. Then, the degree of vacuum in the vacuum chamber 11 of the apparatus was raised to a level of $2\times10^{-3}$ Torr. Adamantane was sublimated by heat and introduced into the vacuum chamber 11 through the gas inlet 14. Hydrogen gas was introduced at a flow rate of 200 SCCM, and, under the conditions of a filament temperature of 2100° C., an inter-electrode spacing of 15 mm, a substrate bias voltage of $-200$ V, and a pressure of 130 Torr, deposition was effected for twenty minutes to form a 2 μm thick layer. The mold temperature during the layer formation was 900° C. to 910° C.

The mold 1 coated with the polycrystalline diamond layer 2 was taken out of the vacuum chamber 11 and placed on the mold holder 52 in the same polishing apparatus 50 as used in Example 1. After evacuating air from the polishing apparatus 50 to a vacuum degree of $3\times10^{-3}$ Torr, hydrogen gas was introduced into the polishing apparatus 50 through the gas inlet 58 at a flow rate of 100 SCCM. An Fe plate 51 containing a diamond powder having an average grain size of 0.5 μm was rotated with the mold holder 52 at a speed of 600 rpm. In this process, heaters 59 and 60 were utilized to heat the Fe plate 51 up to a temperature of 950° C. The surface portion of the Fe plate was formed as a flat surface having a diameter of 80 mm. The surface roughness of the mold after polishing five hours was Rmax190 Å.

On Raman spectrum measurement of the diamond layer on the mold, an acute peak of 1333 cm$^{-1}$ and a broad peak of 1580 cm$^{-1}$ were observed. On reflective electron beam analysis, only diamond was observed. From these results, it was found that the layer on the mold consisted of diamond and amorphous carbon. Further, on elemental analysis of the layer, no elements other than carbon atoms were to be found.

Then, by using this mold, a glass material KF6 (manufactured by Hoya) of a softening point Sp of 470° C. and a glass transition point Tg of 420° C. was pressed into a glass lens in the same way as in Example 1.

Molding was performed 5000 times successively, sampling 100 glass plates at each 100th molding to measure them for surface roughness. The average surface roughness after molding 5000 times was Rmax215 Å.

Example 11

A flat mold formed of WC sintered compact and having a diameter of 5 mm was set in an ion beam apparatus of an acceleration voltage of 1000 V, in which a polycrystalline diamond target was sputtered 20 hours by means of an Ar ion beam to embed diamond cluster in the WC mold surface. Afterwards, a resist pattern in which squares with a side of 48 μm were spread all over was formed on square lattice points of a lattice interval of 50 μm. This mold was set in an ion beam apparatus, in which those portions where no resist had been applied were etched 1 μm by means of an Ar ion beam of an acceleration voltage of 500 V. After removing the resist, this mold was placed on a mold holder 15 in a well-known heat filament apparatus. Then, the degree of vacuum in the vacuum chamber 11 of this apparatus was raised to a level of $2\times10^{-3}$ Torr. Hydrogen and methane were introduced into the vacuum chamber 11 through the gas inlet 14 at a flow rate of 200 SCCM and 0.5 SCCM, respectively, and, under the conditions of a filament temperature of 2100° C., an inter-electrode spacing of 15 mm, and a pressure of 130 Torr, deposition was effected for one hour to form a 10 μm thick layer. The mold temperature during the layer formation was 880° C. to 890° C.

The mold 1 coated with the polycrystalline diamond layer 2 was taken out of the vacuum chamber 11 and placed on the mold holder 52 in the same polishing apparatus 50 as used in Example 1. After evacuating air from the polishing apparatus 50 to a vacuum degree of $3\times10^{-3}$ Torr, hydrogen gas was introduced into the polishing apparatus 50 through the gas inlet 58 at a flow rate of 100 SCCM. An Fe plate 51 containing a diamond powder having an average grain size of 0.5 μm was rotated with the mold holder 52 at a speed of 600 rpm. In this process, heaters 59 and 60 were utilized to heat the Fe plate 51 up to a temperature of 950° C. The surface portion of the Fe plate was formed as a flat surface having a diameter of 80 mm. The surface roughness of the mold after polishing five hours was Rmax200 Å.

On Raman spectrum measurement of the diamond layer on the mold, an acute peak of 1333 cm$^{-1}$ and a broad peak of 1580 cm$^{-1}$ were observed. On reflective electron beam analysis, only diamond was observed. From these results, it was found that the layer on the mold consisted of diamond and amorphous carbon. Further, on elemental analysis of the layer, no elements other than carbon atoms were to be found.

Then, by using this mold, a glass material KF6 (manufactured by Hoya) of a softening point Sp of 470° C. and a glass transition point Tg of 420° C. was pressed into a glass lens in the same way as in Example 1.

Molding was performed 5000 times successively, sampling 100 glass plates at each 100th molding to measure them for surface roughness. The average surface roughness after performing molding 5000 times was Rmax220 Å.

As described above, the optical-element-forming mold of this invention, which is obtained by selectively coating a mold base with a diamond layer, is scarcely susceptible to separation of the diamond layer from the mold surface, is very stable with respect to the heat cycle in molding, and has a satisfactory level of surface roughness for the molding of optical elements, involving no layer separation or deterioration in hardness after molding a great number of times. Thus, the mold is adequately suitable for the molding of optical elements.

Example 12

A concave mold formed of $Si_3N_4$ and having a diameter of 35 mm and a radius of curvature of 45 mm was subjected to ultrasonic processing for two hours in ethanol containing diamond abrasive grains having an average grain size of 20 μm. Afterwards, the mold was subjected to ultrasonic cleaning in ethanol, and then, in acetone, each for ten minutes and sufficiently dried in atmospheric air. A circular resist pattern having a diameter of 0.8 μm was formed on each of the lattice points of a square lattice with a side of 2 μm. Then, the mold surface was etched 5000 Å by means of an Ar ion beam. In this process, only those portions where there was no resist were etched. When, after removing the resist, deposition of diamond was effected, diamond crystals grew in only those portions which had been covered with the resist, thus realizing selective deposition. The mold base 13 from which the resist had been removed was placed on the mold holder 15 in the microwave CVD apparatus shown in FIG. 4. In order to deposit diamond crystals uniformly on the mold, the shaft of the mold holder 15 extends through the air bearing 20 of the vacuum chamber 11 and is connected to the motor 21 provided on the outside. With this mechanism, the mold holder 15 was rotated at reduced pressure at a rate of two rotations per minute.

Then, the degree of vacuum in the vacuum chamber 11 was raised to a level of $2 \times 10^{-3}$ Torr by evacuating air from the chamber inner space through the air outlet 12 by means of a mechanical booster pump and a rotary pump (not shown). The end stages of these pumps are connected in their turn to a gas removing apparatus (not shown), whereby the exhaust gas generated during the layer formation is discharged into the atmosphere. There may be provided only one or more than one inlet 14 for the material gas. The material gas line is connected to a mass flow control system and a gas container (none of which are shown). Only one type of gas or two or more types of gas may be allowed to flow. Further, it is also possible to flow a mixed gas of two or more types. $CH_4$ and $H_2$ gases were introduced in a mixed state through the gas inlet 14 at a flow rate of 3 SCCM and 200 SCCM, respectively, and, by appropriately adjusting the plunger 17 and the sleestab 18 connected to a power source section (not shown), plasma was generated at the position of the mold. The reference numeral 16 indicates a waveguide. Under the conditions of a 2.45 GHz microwave output of 1500 W, a pressure of 200 Torr, and no mold heating, deposition was effected for one hour to form a 2 μm thick layer. The mold temperature during layer formation was from 850° C. to 870° C.

The mold 1 coated with the 2 μm thick polycrystalline diamond layer was taken out of the vacuum chamber and placed in the mold holder 52 of the polishing apparatus 50 shown in FIG. 5. After evacuating air from the inner space of the polishing apparatus 50 through an air outlet 57 to a vacuum degree of $3 \times 10^{-3}$ Torr, hydrogen gas was introduced into the polishing apparatus 50 through the gas inlet 58 at a flow rate of 100 SCCM. An iron plate 51 containing diamond powder having an average grain size of 1 μm was rotated with the mold holder 52 at a speed of 500 rpm by means of the air bearings 53 and 54 and the motors 55 and 56. The surface portion of the iron plate was formed as a convex surface having a diameter of 80 mm and a radius of curvature of 45 mm. The surface roughness of the mold after polishing ten hours was Rma×250 Å.

From SEM observation, the average grain size of the diamond particles on the mold was about 2 μm. On Raman spectrum measurement of the diamond layer, an acute peak of 1333 $cm^{-1}$ and a broad peak of 1580 $cm^{-1}$ were observed. On reflective electron beam analysis, only diamond was observed. The layer was separated from the mold by means of a diamond pen and observed with an electronic microscope. On the observation, amorphous patterns were found in diamond grain boundary sections. It was found from these results that the layer on the mold consisted of diamond.

Subsequently, the press molding of a glass lens was performed by using this mold. FIG. 6 shows the molding apparatus used, which includes a molding device 102, an intake replacement chamber 104, a molding chamber 106, a deposition chamber 108, a release replacement chamber 110, gate valves 112, 114 and 116, a rail 118, and pallets 120 adapted to be fed in the direction of the arrow A on the rail 118. The apparatus further includes cylinders 124, 138, 140 and 150, valves 126 and 152, and heaters 128 arranged in the molding chamber 106 along the rail 118.

Figure 7:
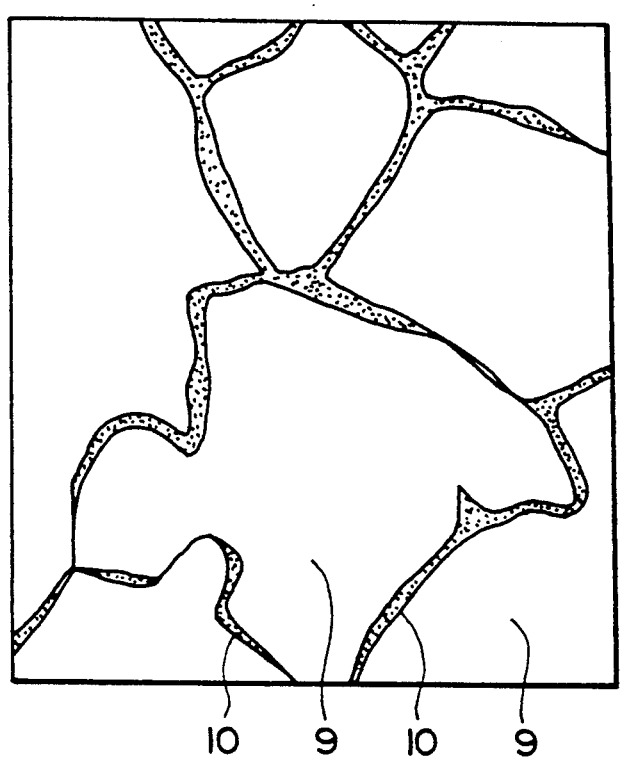
FIG. 7 is a schematic view showing a condition in which amorphous carbon exists only between diamond particles.

The molding chamber 106 is divided into the three zones: a heating zone 106-1, a press zone 106-2, and a slow cooling zone 106-3, arranged in the direction in which the pallet is fed. In the press zone 106-2, an upper mold member 130 is fixed to the lower end of the rod 134 of the cylinder 138, and a lower mold member 132 is fixed to the upper end of the rod 136 of the cylinder 140. These upper and lower mold members 130 and 132 consist of molds formed in accordance with this invention as illustrated in FIG. 7. In the deposition chamber 108, a container 142 containing a deposition substance 146 and a heater 144 for heating this container are arranged.

An optical glass SF14 (manufactured by Hoya) of a softening point Sp of 586° C. and a glass transition point Tg of 485° C. was formed into a predetermined configuration to obtain a blank for molding.

The glass blank was placed on a pallet 120 and set in the position 120-1 in the intake replacement chamber 104, and the pallet at this position was pushed in the direction A so as to convey it to the position 102-2 in the molding chamber 106. Then, in the like manner, pallets, each with a new glass blank, were successively set in the intake replacement chamber 104 with a predetermined timing, each pallet being successively fed from the position 120-2 to the position 120-8 in the molding chamber 106. Meanwhile, the heaters 128 gradually heated the glass blanks so that they were at a temperature above the softening point at the position 120-4 before they were fed to the press zone 106-2, where the cylinders 138 and 140 were operated to cause the upper and lower mold members 130 and 132 to perform molding for five minutes at a pressure of 10 kg/cm². After each pressing, the pressure was canceled, with the temperature being lowered down to a level below the glass transition point. Then, the cylinders 138 and 140 were operated to release the upper and lower mold members 130 and 132 from the molded glass product. In effecting the press molding, the pallets were used as drum members for molding. Afterwards, the molded glass product was gradually cooled in the slow cooling zone 106-3. The molding chamber 106 was filled with nitrogen gas.

Each pallet, which had reached the position 120-8 in the molding chamber 106, was fed in the next feeding step beyond the gate valve 114 to the position 120-9 in the deposition chamber 108, then, beyond the gate valve 116 to the position 120-10 in the release replacement chamber 110. Then, in the next feeding step, the cylinder 150 was operated to take the molded glass product out of the molding apparatus 102 by means of the rod 148.

Table 3 shows the surface roughness of the lens and mold after performing molding 5000 times successively, along with their surface roughness after performing 100 times and 1000 times. After performing molding 5000 times, the surface roughness of the mold had been deteriorated slightly, whereas there was no change in the lens surface roughness.

TABLE 3

| Number of times | Surface roughness (Rmax/μm) | |
|---|---|---|
| of molding | Lens | Mold |
| 100 | 0.030 | 0.025 |
| 1000 | 0.030 | 0.025 |

TABLE 3-continued

| Number of times of molding | Surface roughness (Rmax/μm) | |
|---|---|---|
| | Lens | Mold |
| 5000 | 0.030 | 0.027 |

Comparative Example 3

A diamond layer was deposited on an $Si_3N_4$ mold under the same conditions as in Example 1, except that the methane concentration was changed from 1.5% to 0.3%. It took eight hours to deposit a 2 μm thick layer. This mold was polished and used for press molding as in Example 1. The first lens formed exhibited on its surface a number of protrusions having a diameter of 0.02 μm to 0.2 μm and a height of several thousands of Å, corresponding to the recess portion of the mold, so the molding was stopped.

Example 13

0.1 mg of diamond abrasive grains having an average grain size of 0.2 μm were dispersed over a flat mold, mainly formed of WC, using TiC and TaC as binders, and having a diameter of 40 mm. A resist was applied to these diamond grains, forming a resist pattern consisting of circles having a diameter of 0.8 μm on the lattice points of a square lattice with a side of 2 μm. This mold was placed on the mold holder 15 of the same microwave CVD apparatus as used in Example 1. The holder was rotated at a rate of one rotation per minute.

Then, the degree of vacuum in the vacuum chamber 11 was raised to a level of $2\times10^{-3}$ Torr $C_2H_5OH$ (100 cc in total) was gasified through a bubbler and introduced into the vacuum chamber 11 through the gas inlet 14 along with hydrogen gas (at a flow rate of 200 SCCM), and, by appropriately adjusting the plunger 17 and the sleestab 18, plasma was generated at the position of the mold. Under the conditions of a 2.45 GHz microwave output of 1000 W, a pressure of 90 Torr, and no mold heating, deposition was effected for ten minutes to form a 2 μm thick layer. The mold temperature during the layer formation was 800° C. to 820° C.

The mold 1 coated with the polycrystalline diamond layer 2 was taken out of the vacuum chamber 11 and placed on the mold holder 52 in the same polishing apparatus 50 as used in Example 1. After evacuating air from the inner space of the polishing apparatus 50 to a vacuum degree of $3\times10^{-3}$ Torr, argon gas was introduced into the polishing apparatus 50 through the gas inlet 58 at a flow rate of 10 SCCM. An Ni plate 51 containing a diamond powder having an average grain size of 0.5 μm was rotated with the mold holder 52 at a speed of 600 rpm. The surface portion of the Ni plate was formed as a flat surface having a diameter of 50 mm. The surface roughness of the mold after polishing twenty hours was Rma×200 Å.

On Raman spectrum measurement of the diamond layer on the mold, an acute peak of 1333 $cm^{-1}$ and a broad peak of 1580 $cm^{-1}$ were observed. On reflective electron beam analysis, only diamond was observed. From electronic microscope observation, it was found that amorphous carbon existed only in grain boundary sections. From these results, it was found that the layer on the mold consisted of diamond and amorphous carbon.

Then, by using this mold, an optical glass PSK2 (manufactured by Hoya) of a softening point Sp of 650° C. and a glass transition point Tg of 600° C. was pressed into a glass lens in the same way as in Example 1.

Molding was performed 5000 times successively, sampling 100 glass plates at each 100th molding to measure them for surface roughness. The average surface roughness after molding 5000 times was Rma×250 Å.

Example 14

A resist was applied to a convex mold formed of alumina and having a diameter of 25 mm and a radius of curvature of 45 mm, forming a resist pattern consisting of circles having a diameter of 0.5 μm on triangular lattice points of a lattice interval of 2 μm. Etching was performed 0.3 μm deep by means of an Ar ion beam of an acceleration voltage of 500 eV. After removing the resist, this mold was placed on a mold holder 15 in a well-known direct current CVD apparatus. Ethyl ether (250 cc in total) was gasified through a bubbler and introduced into the vacuum chamber 11 through the gas inlet 14 along with hydrogen gas (at a flow rate of 100 SCCM), and, under the conditions of a direct current of 3000 V, an interelectrode spacing of 15 mm, a pressure of 100 Torr, and no mold heating, deposition was effected for ten minutes to form a 2 μm thick layer. The mold temperature during the layer formation was 820° C. to 840° C.

The mold 1 coated with the polycrystalline diamond layer 2 was taken out of the vacuum chamber 11 and placed on the mold holder 52 of the same polishing apparatus 50 as used in Example 1. After evacuating air from the inner space of the polishing apparatus 50 to a vacuum degree of $3\times10^{-3}$ Torr, hydrogen gas was introduced into the polishing apparatus 50 through the gas inlet 58 at a flow rate of 10 SCCM. An Fe plate 51 containing a diamond powder having an average grain size of 0.5 μm was rotated with the mold holder 52 at a speed of 600 rpm. The surface portion of the Fe place was formed as a concave surface having a diameter of 50 mm and a radius of curvature of 45 mm. The surface roughness of the mold after polishing ten hours was Rma×220 Å.

On SEM observation of the diamond layer on the mold, the grain size of the diamond was about 2 μm. On Raman spectrum measurement of the diamond layer on the mold, an acute peak of 1333 $cm^{-1}$ and a broad peak of 1580 $cm^{-1}$ were observed. On reflective electron beam analysis, only diamond was observed. Further, on elemental analysis of the layer, no elements other than carbon atoms were to be found.

Then, by using this mold, a glass material BK7 (manufactured by Hoya) of a softening point Sp of 630° C. and a glass transition point Tg of 565° C. pressed into a glass lens in the same way as in Example 1.

Molding was performed 5000 times successively, sampling 100 glass plates at each 100th molding to measure them for surface roughness. The average surface roughness after molding 5000 times was Rma×260 Å.

Example 15

A resist was applied to a concave mold formed of $SiO_2$ and having a diameter of 35 mm, forming a resist pattern consisting of circles having a diameter of 1 μm on triangular lattice points of a lattice interval of 3 μm. Etching was performed 0.1 μm deep by means of an Ar focused-ion beam. After removing the resist, this mold was placed on a mold holder 15 in a well-known high-frequency CVD apparatus of 13.65 MHz. Then the degree of vacuum in the vacuum chamber of this apparatus was raised to a level of $2\times10^{-3}$ Torr. Acetaldehyde (200 cc in total) was gasified through a bubbler and introduced into the vacuum chamber 11 through the gas inlet 14 along with hydrogen gas (at a flow rate of 100 SCCM), and, under the conditions of a high-frequency output of 800 W, an inter-electrode spacing of 15 mm, a pressure of 30 Torr, and no mold heating, deposition was effected for three minutes to form a 3 μm thick layer. The mold temperature during the layer formation was 850° C. to 870° C.

The mold 1 coated with the polycrystalline diamond layer 2 was taken out of the vacuum chamber 11 and placed on the mold holder 52 of the same polishing apparatus 50 as used in Example 1. An Fe plate 51 was rotated with the mold holder 52 at a speed of 600 rpm while flowing over the Fe plate an aqueous solution containing a diamond powder having an average grain size of 10 μm. The surface portion of the Fe plate was formed as a concave surface having a diameter of 90 mm and a radius of curvature of 45 mm. The surface roughness of the mold after polishing twenty hours was Rma×270 Å.

On observing the SEM image of the diamond layer on the mold, the average grain size of the diamond was 3 μm. On Raman spectrum measurement of the diamond layer on the mold, an acute peak of 1333 cm$^{-1}$ and a broad peak of 1580 cm$^{-1}$ were observed. On reflective electron beam analysis, only diamond was observed. Amorphous carbon was observed only in grain boundary sections.

Then, by using this mold, a glass material K7 (manufactured by Hoya) of a softening point Sp of 595° C. and a glass transition point Tg of 525° C. was pressed into a glass lens in the same way as in Example 12.

Molding was performed 5000 times successively, sampling 100 glass plates at each 100th molding to measure them for surface roughness. The average surface roughness after molding 5000 times was Rma×290 Å.

Example 16

A flat mold formed of SiC sintered compact and having a diameter of 5 mm was set in an ion beam apparatus of an acceleration voltage of 1000 V, in which a polycrystalline diamond target was sputtered 20 hours by means of an Ar ion beam to embed diamond cluster in the SiC mold surface. Afterwards, a resist pattern in which circles having a diameter of 0.8 μm were spread all over was formed on square lattice points of a lattice interval of 2 μm. This mold was set in an ion beam apparatus, in which those portions where no resist had been applied were etched 1 μm by means of an Ar ion beam of an acceleration voltage of 500 V. After removing the resist, this mold was placed on a mold holder 15 in a well-known electron assist plasma apparatus. Then, the degree or vacuum in the vacuum chamber 11 was raised to a level of $2\times10^{-3}$ Torr.

Adamantane was sublimated by heat and introduced into the vacuum chamber 11 through the gas inlet 14. Hydrogen gas was flowed at a flow rate of 100 SCCM, and, under the conditions of a filament temperature of 2100° C., an interelectrode spacing of 15 mm, a substrate bias voltage of −200 V, and a pressure of 130 Torr, deposition was effected for ten minutes to form a 2 μm thick layer. The mold temperature during the layer formation was 900° C. to 910° C.

The mold 1 coated with the polycrystalline diamond layer 2 was taken out of the vacuum chamber 11 and placed on the mold holder 52 in the same polishing apparatus 50 as used in Example 1. After evacuating air from the polishing apparatus 50 to a vacuum degree of $3\times10^{-3}$ Torr, hydrogen gas was introduced into the polishing apparatus 50 through the gas inlet 58 at a flow rate of 100 SCCM. An Fe plate 51 containing a diamond powder having an average grain size of 0.5 μm was rotated with the mold holder 52 at a speed of 600 rpm. In this process, heaters 59 and 60 were utilized to heat the Fe plate 51 up to a temperature of 950° C. The surface portion of the Fe plate was formed as a flat surface having a diameter of 80 mm. The surface roughness of the mold after polishing five hours was Rma×190 Å.

On Raman spectrum measurement of the diamond layer on the mold, an acute peak of 1333 cm$^{-1}$ and a broad peak of 1580 cm$^{-1}$ were observed. On reflective electron beam analysis, only diamond was observed. From these results, it was found that the layer on the mold consisted of diamond and amorphous carbon.

Then, by using this mold, a glass material KF6 (manufactured by Hoya) of a softening point Sp of 470° C. and a glass transition point Tg of 420° C. was pressed into a glass lens in the same way as in Example 12.

Molding was performed 5000 times successively, sampling 100 glass plates at each 100th molding to measure them for surface roughness. The average surface roughness after molding 5000 times was Rma×215 Å.

As described above, the optical-element-forming mold of this invention, which is obtained by increasing the concentration of the carbon-containing material used and selectively coating the mold surface with diamond, is less susceptible to reaction with the glass during glass molding as compared to a mold coated with a layer consisting of diamond only, and ensures the surface roughness in the molded product, and further, makes it possible to make the deposition speed when forming the diamond layer approximately two to three times higher than in the prior art.

I claim:

1. A mold for forming optical elements of glass by press molding, comprising a mold base on which at least a molding surface thereof is coated with diamond crystals in such a manner that the diamond crystals are formed at predetermined portions selectively in a dispersed state, and areas adjacent to where each diamond crystal is formed are not in contact with each other.

2. A mold according to claim 1, wherein said diamond crystals of the dispersed state consist of diamond polycrystals.

3. A mold according to claim 1, wherein said diamond crystals of the dispersed state consist of diamond monocrystals.

4. A mold according to claim 1, wherein amorphous carbon exists in the diamond crystals of the dispersed state.

5. A mold for forming optical elements of glass by press molding, comprising a mold base on which at least a molding surface thereof is coated with a film consisting of diamond monocrystals existing in predetermined portions and amorphous carbon existing between the diamond monocrystals.

* * * * *

UNITED STATES PATENT AND TRADEMARK OFFICE
CERTIFICATE OF CORRECTION

PATENT NO. : 5,246,198
DATED : September 21, 1993
INVENTOR(S) : NORIKO KURIHARA

It is certified that error appears in the above-indentified patent and that said Letters Patent is hereby corrected as shown below:

COLUMN 1
    line 17, "techniques" should read --technique--; and
    line 24, "an" should read --a--.

COLUMN 3
    line 36, "abovementioned" should read --above-mentioned--.

COLUMN 4
    line 24, "to 11mm$^2$" should read --to expand to 11mm$^2$--;
    line 25, "to 10.1" should read --to expand to 10.1--;
    line 65, "by" should read --be--; and
    line 67, "form" should read --to form--.

COLUMN 5
    line 30, "face twin" should read --twin face--.

COLUMN 8
    line 46, "102-2" should read --120-2--.

UNITED STATES PATENT AND TRADEMARK OFFICE
CERTIFICATE OF CORRECTION

PATENT NO. : 5,246,198
DATED : May 30, 1991
INVENTOR(S) : NORIKO KURIHARA

It is certified that error appears in the above-indentified patent and that said Letters Patent is hereby corrected as shown below:

COLUMN 13
line 47, "Au" should read --Ar--.

COLUMN 20
line 23, "102-2" should read --120-2--.

COLUMN 21
line 33, "Torr" should read --Torr,--.

COLUMN 23
line 61, "interelectrode" should read --inter-electrode--.

Signed and Sealed this

Twenty-eighth Day of June, 1994

Attest:

BRUCE LEHMAN

*Attesting Officer*    *Commissioner of Patents and Trademarks*